United States Patent [19]
Cloud et al.

[11] Patent Number: 5,714,802
[45] Date of Patent: Feb. 3, 1998

[54] HIGH-DENSITY ELECTRONIC MODULE

[75] Inventors: Eugene H. Cloud; Alan G. Wood, both of Boise, Id.

[73] Assignee: Micron Technology, Inc., Boise, Id.

[21] Appl. No.: 220,475

[22] Filed: Mar. 31, 1994

Related U.S. Application Data

[63] Continuation of Ser. No. 716,881, Jun. 18, 1991, abandoned.

[51] Int. Cl.$^6$ .................. H01L 23/16; H01L 23/42
[52] U.S. Cl. .................. 257/726; 257/723; 257/724; 257/727; 257/725; 257/777; 361/688; 361/697; 361/702
[58] Field of Search .................. 357/68, 69, 75; 257/777, 723, 724, 725, 726, 727; 361/688, 697, 702

[56] References Cited

U.S. PATENT DOCUMENTS

| | | | |
|---|---|---|---|
| 3,705,332 | 12/1972 | Parks | 317/101 CM |
| 4,555,720 | 11/1985 | Readhead | 357/30 |
| 4,567,643 | 2/1986 | Drouguet et al. | 29/575 |
| 4,613,891 | 9/1986 | Ng et al. | 357/68 |
| 4,697,095 | 9/1987 | Fujii | 307/243 |
| 4,709,300 | 11/1987 | Landis | 361/398 |
| 4,709,468 | 12/1987 | Wilson | 437/209 |
| 4,744,008 | 5/1988 | Black et al. | 361/386 |
| 4,751,564 | 6/1988 | Landis | 257/723 |
| 4,888,625 | 12/1989 | Mueller | 357/17 |
| 4,939,568 | 7/1990 | Kato et al. | 257/723 |
| 4,964,875 | 10/1990 | Clements | 357/75 |
| 5,138,437 | 8/1992 | Kumamoto et al. | 257/723 |

FOREIGN PATENT DOCUMENTS

| | | | |
|---|---|---|---|
| 0202958 | 10/1985 | Japan | 357/75 |

*Primary Examiner*—Robert P. Limanek
*Assistant Examiner*—Valencia Martin Wallace

[57] ABSTRACT

A highly dense electronic module for installation into a computer or other electronic device comprises at least one wafer or wafer section and means for connection with the electronic device. With an embodiment comprising plural wafer sections, the wafer sections are mechanically joined and electrically coupled.

25 Claims, 7 Drawing Sheets

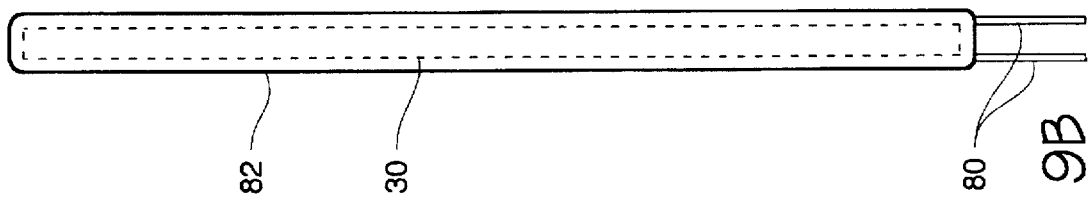
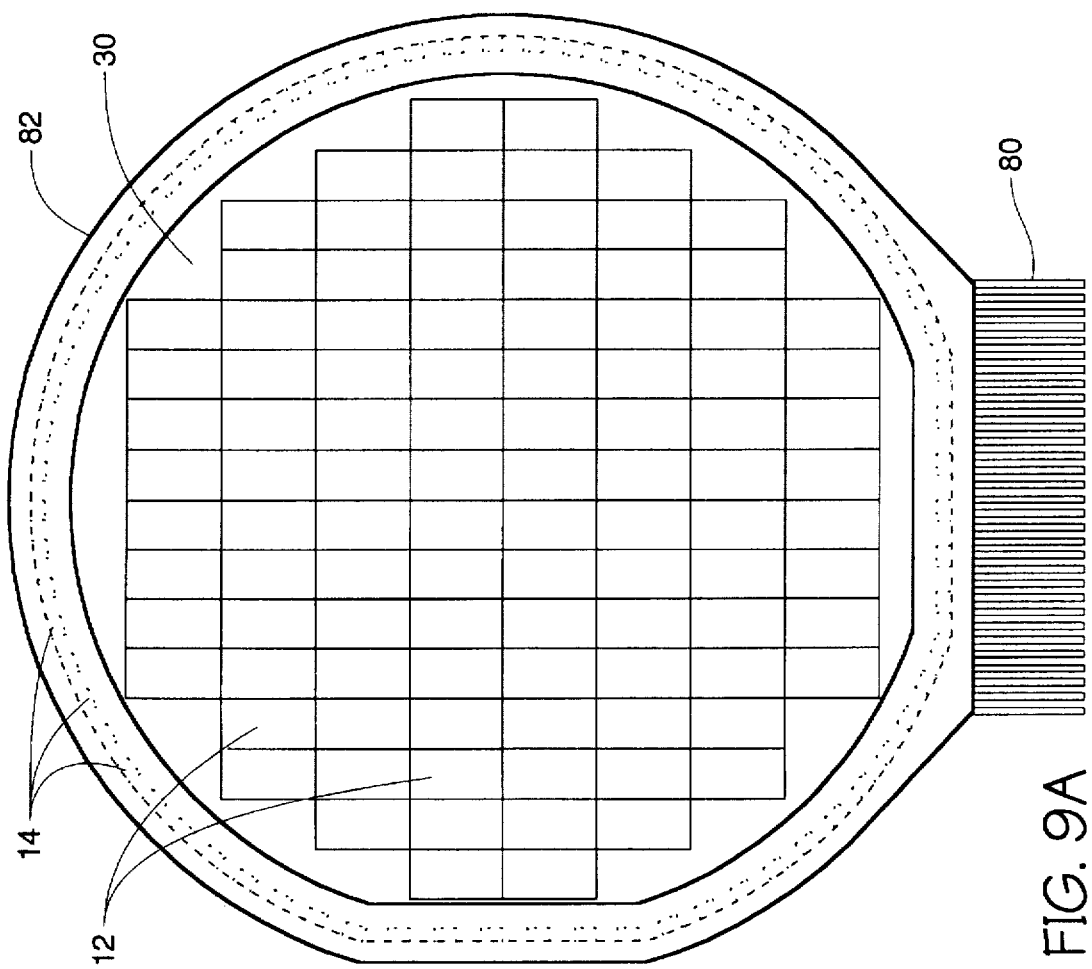

HIGH-DENSITY ELECTRONIC MODULE

CROSS REFERENCE TO RELATED APPLICATION

This is a continuation of application Ser. No. 07/716,881, filed Jun. 18, 1991, now abandoned.

FIELD OF THE INVENTION

This invention relates to semiconductor wafer arrays. More specifically, it concerns a method for electrically and mechanically coupling a plurality of stacked semiconductor wafers into an integrated array. A second embodiment of the invention stacks a plurality of wafer sections, coupling them into one discrete component.

BACKGROUND OF THE INVENTION

Various types of semiconductor devices are manufactured in much the same way. A starting substrate, usually a thin wafer of silicon or gallium arsenide, is masked, etched, and doped through several process steps, the steps depending on the type of devices being manufactured. This process yields a number of die with circuitry formed thereon and therein on each wafer produced. The die are separated with a die saw, and then packaged into individual components. During the packaging process, bond wires are connected from each of several bond pads on each die to conductive leads. The die, the wires, and a portion of the leads are encapsulated in plastic or encased in ceramic. These leads couple the die with the device into which the component is installed, thereby forming a means of input/output (I/O) between the die and the device.

Electronic devices of any sophistication have multiple semiconductor die of some form installed, for example one or more central processing units (CPU), static random access memory (SRAM), and dynamic random access memory (DRAM). In the case of memory, several DRAMs are installed in even a simply designed computer of limited function. Even though the amount of memory on each DRAM die is increasing with advances in technology, it is still necessary in most cases to install a plurality DRAMs for the computer to function adequately.

Since several of the devices must be installed in a computer, it becomes counterproductive to singulate each die from the wafer during the manufacturing process only to reconnect them (using DRAMs as an example) as a bank of memory in a computer. The process to package each individual die is time consuming and therefore expensive, and the wire which couples the die pads with the leads is a point which has a high failure rate. The multitude of bond wires also reduces system performance due to signal propagation delay.

The DRAM yield from several wafers are typically installed in mainframe computers, along with CPUs, SRAMs, cache memory, main memory, and I/O to produce a variety of powerful computer systems. It would be more cost effective and would increase system performance to integrate several wafers into one unit for installation into the computers, therefore alleviating the need for singulating the die from each wafer, packaging the die into DRAMs, and reconnecting the die as banks of memory in the computer. Indeed, such wafer scale integrated (WSI) technology designs have been previously described. Various problems have arisen from described designs. The means used for mechanically coupling the wafers is one such problem. If the wafers are solidly enjoined, thermal expansion of the wafer during the normal course of operation can damage wafers due to differences in thermal coefficients of expansion between the wafers and the material used to join the wafers.

U.S. Pat. No. 4,954,875 describes a means of electrically interconnecting a stack of wafers by drilling through the wafers, coating the vias with an insulator, filling the vias with a conductive material, and electrically coupling appropriate points across wafers.

SUMMARY OF THE INVENTION

An object of this invention is to provide a high-density semiconductor component.

A second object of this invention is to provide a semiconductor component which is substantially less expensive to manufacture than a quantity of individually packaged die while providing the same functionality.

A further object of this invention is to provide a semiconductor component which is easier to manufacture than a quantity of individually packaged die while providing the same functionality.

Another object of this invention is to provide a semiconductor component which has improved performance over a quantity of individually packaged die while providing the same functionality as a result of reduced signal propagation delay due to shorter trace lengths.

Another object of this invention is to provide means for combining wafers or wafer sections of several different types of components, or combining wafers or wafer sections each having different types of components, into a single unit.

These objects of the invention are accomplished by laying down additional conductive and insulating layers of material on the surfaces of completed wafers comprising a plurality of die, mechanically coupling the wafers with a compliant, heat-absorbing material, electrically coupling the wafers into a functional unit or units, and providing means for I/O between the wafer stack and the electronic device into which the wafer stack will be installed.

The wafers used as an element of the invention can be wafers which have been fabricated for singulation but with additional conductive and insulative layers laid down during fabrication, or the wafers can be manufactured specifically for use with the invention. With a wafer fabricated for singulation, additional layers of conductive material, such as a metal mask of aluminum, gold, or other conductive materials interconnect the bond pads of the die as prescribed by each individual design. These conductive layers are electrically separated with layers of nonconductive materials such as $SiO_2$, $Si_3N_4$, or nonconductive polymers. After connecting the bond pads of the die, the metal layers wrap around the edge of the wafer and terminate, thereby forming contacts on the thin edge of the wafer as described in U.S. Pat. No. 5,146,308 which is incorporated herein by reference. As described in the referenced document, these contacts on the edge of the wafer can also be formed by fabricating traces to the edge of the wafer and buffing or etching back the edge to expose the metal. Contacts can completely encircle the edge of the wafer, or be can limited to any portion or portions thereof. In wafers fabricated for use as a component of the invention, the proper system connections are made on the top of the wafer, and the system metal contacts also extend to the edge of the wafer.

Upon the completion of all metal and insulating layers, the surface of the wafer is coated with a passivating layer of a material such as silicon nitride or silicon dioxide to protect the circuitry from possible damage at later assembly steps.

Passivating a wafer surface is a step common in semiconductor manufacturing technology.

After fabrication of the individual wafers using WSI technology, a plurality of wafers are mechanically coupled, the exact number of wafers following from the requirements of the design. Coupling can be accomplished through the use of nonconductive epoxy, nonconductive polymer, or with any other workable material. The material used, however, should be heat conductive to draw heat away from the operating wafers and to dissipate the heat to the exposed surface of the material. The property of conducting heat therefore prevents damage to an internal wafer due to overheating. In addition, the material used to join the wafers should have a thermal coefficient of expansion which is compatible with that of the wafer to prevent damage of the unit from thermal mismatch and provide enough mechanical compliance to prevent thermal expansion or contraction damage.

Once the wafers are mechanically joined they are electrically coupled into a circuit. The method of making the electrical connection depends on the type of electrical contacts formed on the wafers. One method of making the contacts, as previously indicated, is described in U.S. Pat. No. 5,146,308.

Another method of making the electrical contacts is to etch back the silicon of the wafer and the polymer which joins the wafers, thereby leaving minute "beams" of metal protruding from the sides of the wafers. The etching of the silicon of the wafer and the material used to join the wafers can be accomplished with any workable means. For example, the silicon of the wafer can be mechanically polished with means used to make raw silicon ingots true round, with methods well known in the art, or chemically etched. The polymer which mechanically couples the wafers can also be chemically etched, or etched with using standard plasmas and equipment (for example using freon 14 or freon 23). The metal beams are then electrically coupled in a manner determined by the individual design of the component comprising the invention. Coupling of the contacts of the wafers can be accomplished by a flex circuit as used in tape automated bonding (TAB), or by the use of pressure contacts.

If a flex circuit is used, it may be necessary to bump the individual contacts on the wafer(s) or bump the flex circuit with a soft metal (or series of metals) which has a low melting point in order to facilitate bonding of the contacts of the flex circuit with the contacts of the wafers. Also, a barrier on the wafer contacts or flex circuit contacts may be required to allow the bumped metal to bond properly to the contacts. The barrier can be evaporated onto the surface of the wafer by chemical vapor deposition (CVD), sputtered, or deposited by any workable means. The type of barrier material used depends on the type of metal used to bump the contacts. For a gold bump, the barrier material can be a layer of titanium followed by a layer of tungsten. If the bumped metal is a solder mixture of tin and lead, the barrier material can be a layer of copper. After the barrier is applied and the surface is bumped with the soft metal, first and second contacts on the flex circuit are contacted with first and second beams of metal on the wafer. The flex circuit may be applied in strips, or more preferably, wrapped as a single unit around the wafer stack. After the contacts of the flex circuit are positioned to contact the beams of the wafer, the joint is heated to flow the metal thereby soldering the beam on the wafer to the contact on the flex circuit.

To use pressure contacts, a material such as a z-axis conductive epoxy can be used. This material forms a conductor under areas where pressure is applied, but is an insulator in areas where no pressure is applied. To use this material, the semiviscous epoxy is applied to the wafer stack, and pressure is applied to the appropriate places, for example by a clamp to create the pressure during the cure of the epoxy. After the epoxy cures, the clamp is removed thereby leaving the material conductive in the correct locations.

A third method of making contact between the beams of metal protruding from the wafer stack is to use an elastomeric conductive polymer interconnect such as that available from AT&T Microelectronics. This type of polymer is conductive in areas where pressure is applied, but not in areas where no pressure is applied. Once the pressure is removed, the material reverts to its nonconductive state. Pressure could be applied by a clamp such as that described above, but would remain a permanent fixture of the wafer stack.

Once connections are made to the wafer contacts with flex circuits or pressure connections, means must also be provided for allowing electrical coupling of the wafers with the electronic device into which it is installed. This can be accomplished with a clamp which makes electrical contact with the exposed metal pads of the top wafer, and which provides connection means for coupling with the electronic device into which it is installed. In an embodiment which uses the conductive polymer to interconnect the beams of the wafers, the clamp used for determining the conductivity of the polymer could also provide connection means between the wafer stack and the electronic device into which the stack is installed. Since the beams of each wafer are interconnected to those of all other wafers by the TAB tape or by the polymer, the clamp would need to couple only with the contacts on the top wafer. Leads or other connection means on the bottom of the clamp would interface with the electronic device into which the wafer stack is installed.

Since it is unlikely that 100% of the die on a wafer is functional, means must be applied for removing nonfunctional die from the memory unit. For die which are nonfunctional from the time they are manufactured, this could be accomplished by electrically removing them from the wafer, for example by disconnecting them using electrically programmed fuzes which are well known in the semiconductor industry. This could be accomplished by testing the die on the wafer before the final metallization of the wafer, and bypassing the nonfunctional die. If a die malfunctions after it has been operative for some time, the die could be removed from operation through software means.

Another embodiment which may be advantageous is to provide a single wafer having clamping means, with the clamping means providing an electrical interface between the wafer and the electronic device into which it is installed. This would allow replacement of a single wafer, and would allow cooling between the wafers.

With no conceptual modifications, this invention is transferrable for use on wafer sections rather than the complete wafer. This embodiment would provide for a very small, highly dense logic device. Connection of the wafer sections would proceed identically to the connection of a wafer, except that the wafer sections would be singulated before they are joined and can be rectangular in shape. After singulation of the wafer sections, the wafer sections would be joined with the polymer material. The silicon and polymer could be etched back to expose the beams of metal, and the metal beams or other contact pads would be coupled using TAB or pressure contacts.

BRIEF DESCRIPTION OF THE DRAWINGS

FIG. 9A shows a front view of a single wafer contained in a clamp;

FIG. 9B shows a side view of the FIG. 9A assembly;

DETAILED DESCRIPTION OF THE PREFERRED EMBODIMENT

Figure 1:
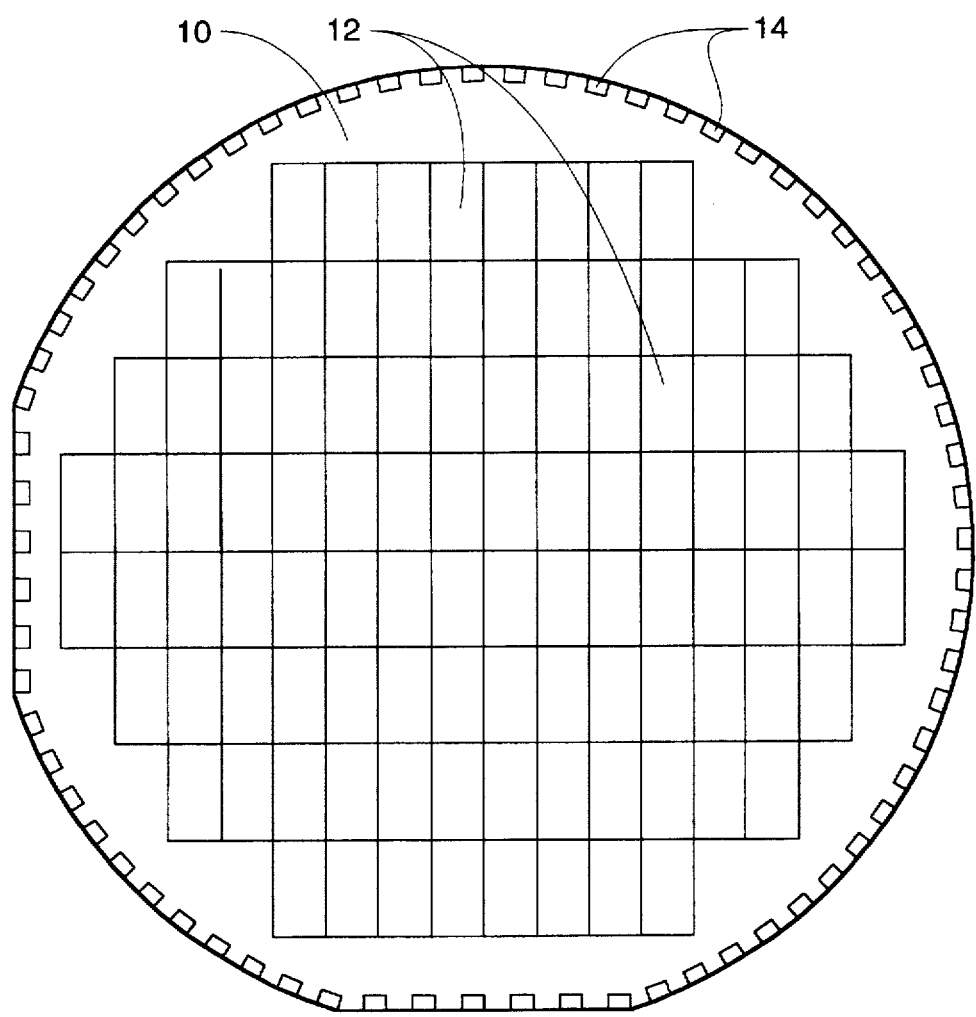
FIG. 1 describes a wafer having die and contact pads.
Figure 2:
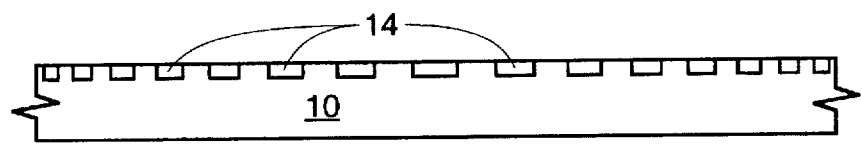
FIG. 2 shows a side view of a wafer having contact pads which extend over the edge of the wafer.

FIG. 1 shows a wafer 10 having die 12 fabricated onto the wafer 10. In addition to the die 12, the wafer also contains contact pads 14 around its edge at a location remote from the die 12 as shown. The contact pads 14 can wrap around the edge of the of the wafer 10 as shown in FIG. 2, or can terminate at the edge of the wafer 10. In addition, the pads 14 can be located entirely around the periphery as shown, or around only a portion or portions of the wafer 10. The die 12 and contact pads 14 are manufactured by means known in the art.

After the die 12 and contacts 14 have been manufactured onto the wafer surface, the top side of the wafer is coated with a passivation layer (not shown) to prevent damage to the circuitry (not shown) at later assembly steps. Passivating the top surface of a wafer for protection of circuitry is well known to one of ordinary skill in the art.

Figure 3:
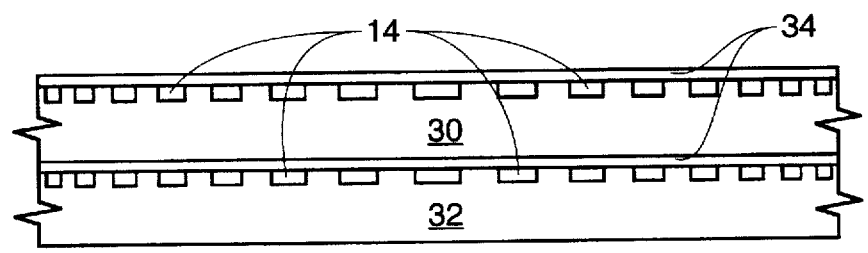
FIG. 3 is a side view of a pair of mechanically coupled wafers.

After a plurality of wafers 10 with the die 12 and contact pads 14 have been fabricated, the wafers 10 are mechanically enjoined as shown in FIG. 3. The number of wafers attached depends on the design of the individual component. FIG. 3 shows two wafers 30, 32. In any case, the bottom (back) surface of a first wafer 30 is connected to the top (front) surface of a second wafer 32 with a workable material 34 such as a nonconductive epoxy or nonconductive polymer. Any material used to join the wafers 30, 32, however, should be thermally conductive to draw and dissipate heat away from the operating wafers 30, 32. The property of conducting heat therefore prevents damage to an internal wafer due to overheating. In addition, the material 34 used to join the wafers 30, 32 should have a thermal coefficient of expansion which is compatible with that of the wafer to prevent damage of the unit from thermal mismatch and to provide enough mechanical compliance to prevent thermal expansion or contraction damage. A material such as QL3400, available from DuPont is one example of a material which would serve this purpose.

Figure 4:
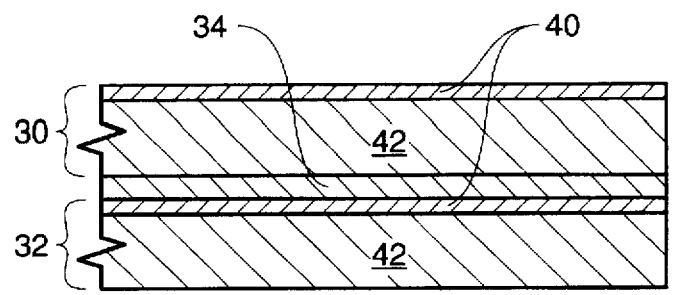
FIG. 4 is a cross section of FIG. 3 wafers.
Figure 5:
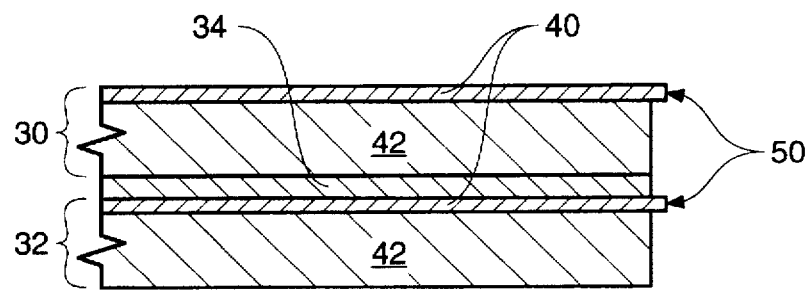
FIG. 5 shows the FIG. 4 wafers subsequent to etching back the silicon and mechanical wafer interconnect to form beams of metal protruding from the side of the wafers.

Referring to FIGS. 4–7, after the wafers 30, 32 are mechanically joined, the circuitry 40 on the top of the wafers 30, 32 are electrically coupled, the pattern of connection depending on the design of the component. A preferred method of electrically coupling the circuitry 40 of the wafers 30, 32 starts with a step to etch back the silicon 42 of the wafers 30, 32 and the polymer wafer interconnect 34. The method of etching back the silicon 42 and polymer 34 is not for use with contact pads which wrap around the edge of the wafer. FIG. 4 shows circuitry 40 which does not wrap around the edge of the wafer 30, 32 to form a contact. Etching back the silicon 42 and polymer 34 exposes beams of metal 50 which form the contacts around the edge of the wafers 30, 32 which are then electrically coupled by any workable method.

Figure 6:
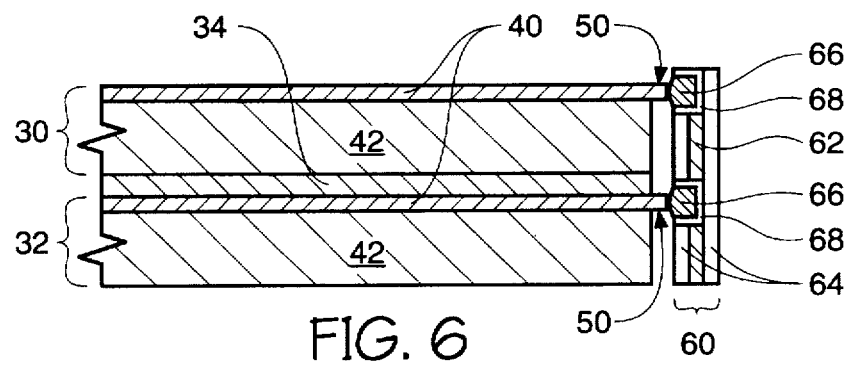
FIG. 6 shows a first step in the attachment of a flex circuit the beams of metal.
Figure 7:
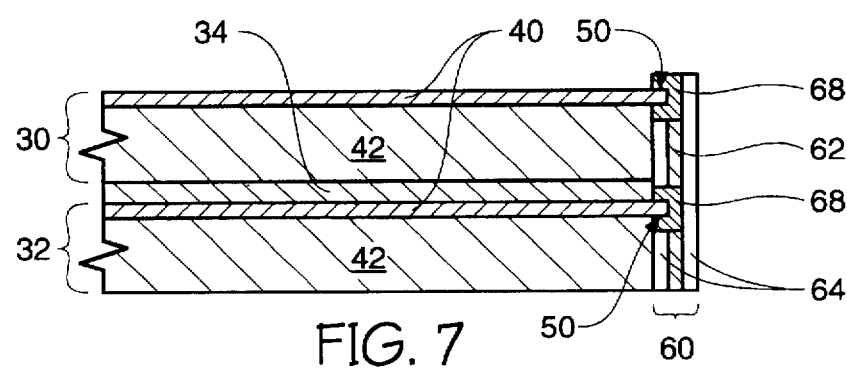
FIG. 7 describes the flex circuit attachment to the beams of metal protruding from the wafer.

One method of coupling the beams of metal 50 includes a flex circuit 60 made with tape automated bonding techniques as shown in FIGS. 6 and 7. The flex circuit 60 comprises a conductor (trace) 62 sandwiched between insulating material 64. Flex circuit contacts comprise solder 66, which will bond with the beams of metal 50 on the wafers 30, 32, and can further comprise a noble metal 68 which facilitates bonding of the solder 66 with the conductive trace 62 within the flex circuit 60. The layout of the conductor 62 within the flex circuit 60 depends on the individual design of the multi-wafer component. In any case, the customdesigned flex circuit 60 would wrap around the wafer stack, the beams of metal 50 of the wafers 30, 32 mating with the solder 66 of the flex circuit as shown in FIG. 6. It can be seen from FIG. 6 that the electrical connection formed by elements 66 and 62 which electrically couples circuitry on the wafers 30, 32 is remote from the wafers. The flex circuit 60 and wafer stack are heated to flow the solder 60 thereby coupling the metal beams 50 with the traces 62 within the flex circuit 60 as shown in FIG. 7. It can further be seen from FIG. 7 that electrically coupling the beams 50 electrically couples the circuitry 40 on the wafers 30. The noble metal 68 if used is integrated into the solder 66, and is therefore not shown in FIG. 7.

A second method of coupling the beams of metal or with metal contacts which wrap around the edge of the wafer is to use a conductive epoxy interconnect. The epoxy is applied to the surface of the wafers, and a clamp is positioned on the wafer to apply pressure to the areas where conductivity is required. These areas of pressure become conductive as they cure, while the nonpressurized epoxy cures in an insulative state. Once the epoxy cures the clamp is removed.

A third method of coupling the beams of metal or with metal contacts which wrap around the edge of the wafer is to use a conductive polymer sheet. This material is similar to the conductive epoxy in that it becomes conductive as pressure is applied. It returns to its nonconductive state, however, when the pressure is removed. This material does not cure, but is a sheet of flexible material. One source of the material is Bridgestone Japan. In this embodiment, the clamp would remain in place as a part of the multiwafer component.

Figure 8:
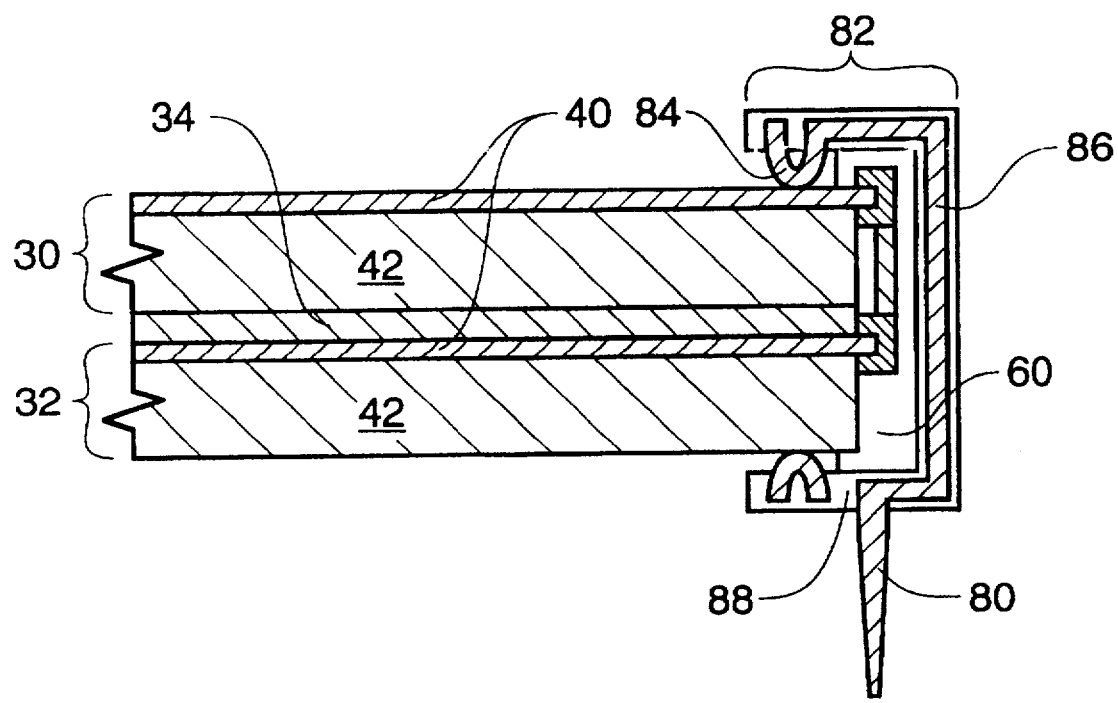
FIG. 8 shows a cross section of the wafers after attachment of a clamp which contacts the circuitry of the top wafer and provides attachment means for the host.

After the interconnections between the contact pads of the wafers are made, means must be provided for allowing the wafer stack to interface with the device into which it will be installed. FIG. 8 shows one possible means. Leads 80 or other interface means can be provided by a clamp 82 which couples with the circuitry 40 of the top wafer 30 in the stack, and transfers the signals from the circuitry 40 to output leads 80 on clamp 82. Since the circuitry of the wafers 30, 32 are coupled with the flex circuit 60, contacting the circuitry 40 of the top wafer 30 provides proper conditions for transferring signals from internal wafers 32 to the clamp 82. The clamp 82 can be of various designs. In an embodiment which uses the polymer sheet to couple the pad contacts of the wafers, the clamp which applies pressure to the sheet can also provide interface means with the host. In any case, the clamp 82 must have means for coupling with the circuitry 40 of the wafers 30, 32, and transferring each required signal to the host. The contact means of the clamp 82 can be wire leads 84 which couple with the circuitry 40 as shown in FIG. 8. The clamp itself 82 would have conductive traces 86 to transfer the signal from the circuitry 40 to leads 80, the conductive traces 86 being separated by insulative material 88. The leads 80 would then interface with the host. Intervening ground traces (not shown) may be required to dampen noise between the numerous data traces 86.

The above techniques, if applied to a single wafer, would also provide a useful component with some advantages over a multiwafer embodiment. A clamp which couples with the contact pads manufactured onto a wafer and which supplies means for interface with a host, would more easily be cooled than a stack of wafers mechanically coupled with polymer or another workable material. A single wafer embodiment would not require that wafers be enjoined, nor would it require etching back of the silicon wafer to expose beams of metal for coupling with beams of other wafers. FIGS. 9A and 9B show a single wafer embodiment. The clamp 82 provides an interface with the host with two rows of leads 80. The wafer 30 is encased in the clamp 82.

Figure 10:
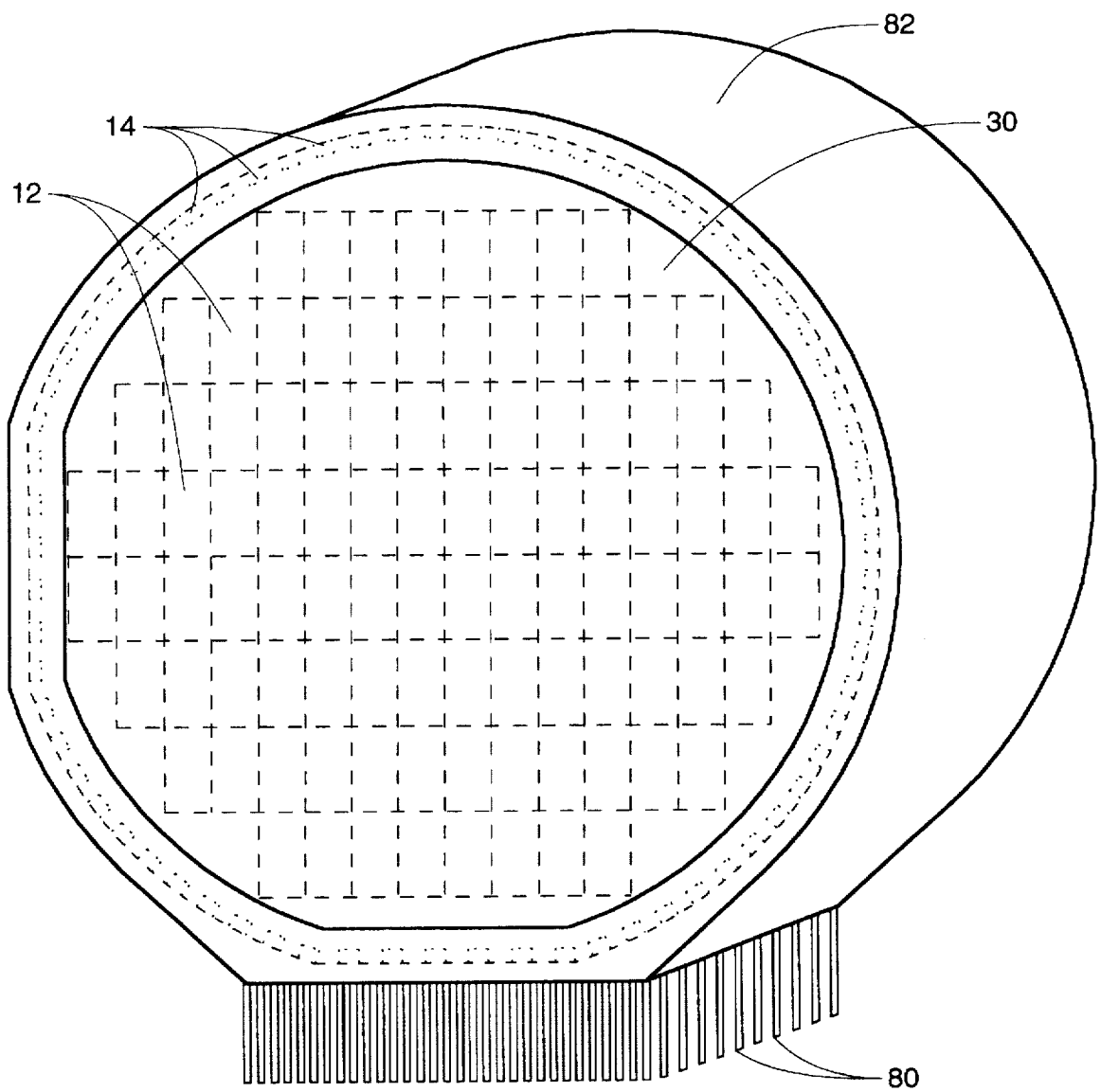
FIG. 10 shows an isometric view of a plurality of wafers assembled within a clamp, the clamp providing leads for attachment to a host.

FIG. 10 shows an embodiment which comprises multiple wafers. This embodiment requires that the wafers be mechanically and electrically coupled with one of the methods described previously, or any workable technique. The clamp 82 contacts the contact pads 14 of the top wafer 30, and transfers the signals to the leads 80 where they couple with the host.

Figure 11:
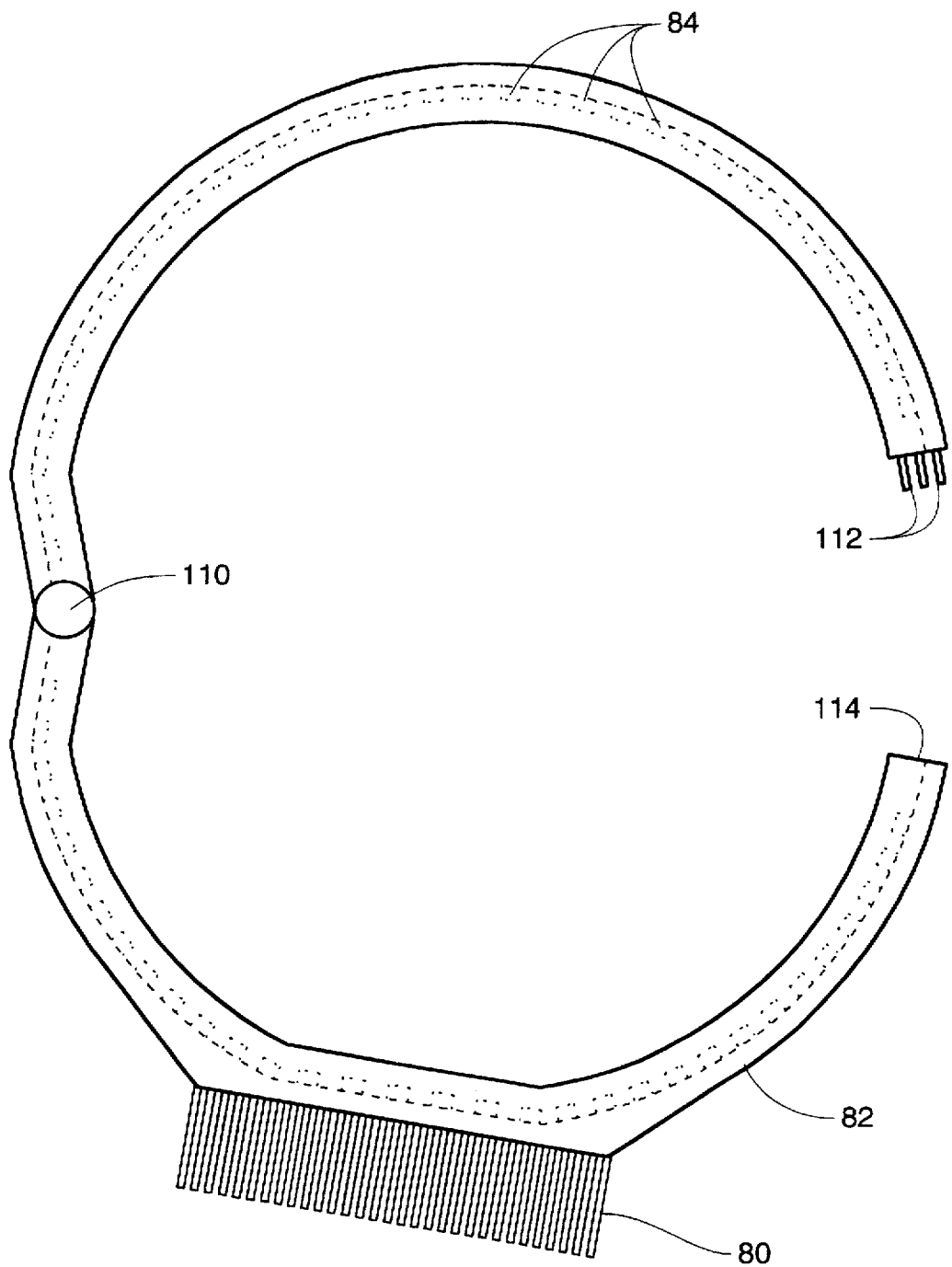
FIG. 11 shows a hinged clamp which allows insertion of a wafer or wafers.

FIG. 11 shows a hinging mechanism 110 which allows the clamp to be placed over the wafer. The signals on the half of the clamp which is distal to the leads 80 must be able to electrically span the hinge. The hinge 110 can have electrical traces which provide for signals to be carried across it, for example with a flexible cable such as a ribbon cable or a cable manufactured with tape automated bonding techniques. Another method is to provide pins 112 to mate with contacts 114 thereby carrying the signals from the wafer contact pads (not shown) to the wire leads on the clamp 84 to the clamp leads 80. A third method is to provide a flexible cable (not shown) which spans the hinge and carries the signals around the hinge. Other workable means are possible.

After the multiwafer component is installed, it is likely that die will fail after a time during operation. An occasional self test implemented in software would test each die and map out the malfunctioning die or malfunctioning bits to prevent improper data from being supplied by the component. A list of improperly functional bit locations would be kept and the bits at those locations would not be used. Additionally, error correction coding (ECC) would build redundancy into the component. Adding an additional wafer to function as an ECC unit would increase the accuracy and longevity of the multiwafer component.

The multiwafer techniques above can also be applied to wafer sections as well as the entire wafer. A plurality of square wafer sections, for instance, could be enjoined in the manner described. If the wafer sections contain different types of logic, for instance a microprocessor, cache memory, and static random access memory, a very compact, high-speed logic device could be supplied.

What have been described are specific configurations of the invention, as applied to particular embodiments. Clearly, variations can be made to the original designs described in this document for adapting the invention to other embodiments. For example, a large variety of clamping means and designs therefor can be determined by one skilled in the art. Various types of logic devices can be integrated into a single element thereby providing a wide variety of component types. Therefore, the invention should be read as limited only by the appended claims.

We claim:

1. A component for an electronic device, comprising:
   a) first and second semiconductor wafers, each of said wafers comprising a semiconductor substrate having a front with a plurality of die formed thereon and therein and a back;
   b) an electrically nonconductive interconnect flexibly connecting said wafers, said back of said first wafer connected with said front of said second wafer, wherein said interconnect expands and contracts as said wafers expand and contract;
   c) an electrical connection at a location remote from said wafers which electrically couples circuitry on said wafers including beams of conductive circuitry along an edge of said wafers; and
   d) means for electrically coupling said wafers with the electronic device.

2. The component of claim 1 wherein said electrically nonconductive interconnect comprises a heat conductive material such that heat is conducted away from said wafers and is dissipated.

3. The component of claim 1 wherein said electrical connection which electrically couples said circuitry on said wafers further includes a flex circuit which forms a conductive path between selected beams, said flex circuit having at least first and second contacts and a trace electrically coupling said first and second contacts, with at least two of said conductive beams being electrically coupled thereby.

4. The component of claim 1 wherein said electrical connection which electrically couples said circuitry on said wafers further includes an epoxy having the property of becoming conductive when pressure is applied as it cures and remaining nonconductive when pressure is not applied as it cures. Wherein said epoxy is applied to conductive beams located along an edge of said semiconductor wafers and pressure is selectively applied to epoxy as it cures so as to form a conductive path between selected beams on said first and second semiconductor wafers thereby electrically coupling said wafers.

5. The component of claim 1 wherein said electrical connection for electrically coupling said circuitry on said wafers further includes a sheet having the property of becoming conductive when pressure is applied and remaining nonconductive when pressure is not applied, wherein said sheet contacts conductive beams located along an edge of said semiconductor wafers and pressure is selectively applied so as to form a conductive path between selected beams on said first and second semiconductor wafers thereby electrically coupling said wafers.

6. The component of claim 5 wherein a clamp selectively applies pressure to said sheet so as to form a conductive path between at least two of said beams located along said edge of said semiconductor wafers.

7. The component of claim 1 wherein said means for coupling said wafers with the electronic device includes a clamp wherein contacts on said clamp couple with said wafers and receives electrical signals therefrom, and transfers said electrical signals to the electronic device.

8. The component of claim 7 wherein said electrical signals are transferred from said wafers to the electronic device through leads on said clamp.

9. The component of claim 1 wherein said component supplies memory to the electronic device.

10. A component for an electronic device, comprising:
   a) first and second wafer sections, each of said wafer sections comprising a semiconductor substrate having a front with a plurality of die formed thereon and therein and a back;
   b) an electrically nonconductive interconnect flexibly coupling said wafer sections, said back of said first wafer section connected with said front of said second wafer section, wherein said interconnect expands and contracts as said wafer sections expand and contract;
   c) an electrical connection at a location remote from said first and second wafer sections which electrically couples circuitry on said wafer sections including beams of conductive circuitry along an edge of said wafer sections; and
   d) means for electrically coupling said wafer sections with the electronic device.

11. The component of claim 10 wherein said electrically nonconductive interconnect comprises a heat conductive material such that heat is conducted away from said wafer sections and is dissipated.

12. The component of claim 10 wherein said electrical connection which electrically couples said circuitry on said wafer sections further includes a flex circuit which forms a conductive path between selected beams, said flex circuit having at least first and second contacts and a trace electrically coupling said first and second contacts, with at least two of said conductive beams being electrically coupled thereby.

13. The component of claim 10 wherein said electrical connection which electrically couples said circuitry on said wafer sections further includes an epoxy having the property of becoming conductive when pressure is applied as it cures and remaining nonconductive when pressure is not applied as it cures, wherein said epoxy is applied to conductive beams located along an edge of said wafer sections and pressure is selectively applied to epoxy as it cures so as to form a conductive path between selected beams on said first and second wafer sections thereby electrically coupling said wafer sections.

14. The component of claim 10 wherein said electrical connection for electrically coupling said circuitry on said wafer sections further includes the use of a sheet having the property of becoming conductive when pressure is applied and remaining nonconductive when pressure is not applied, wherein said sheet contacts conductive beams located along an edge of said wafer sections and pressure is selectively applied so as to form a conductive path between selected beams on said first and second wafer sections thereby electrically coupling said wafer sections.

15. The component of claim 14 wherein a clamp selectively applies pressure to said sheet so as to form a conductive path between at least two of said beams located along said edge of said wafer sections.

16. The component of claim 10 wherein said means for coupling said wafer sections with the electronic device includes a clamp wherein contacts on said clamp couple with said wafer sections and receives electrical signals therefrom, and transfers said electrical signals to the electronic device.

17. The component of claim 10 wherein said electrical signals are transferred from said wafer sections to the electronic device through leads on said clamp.

18. The component of claim 10 wherein said component comprises at least two types of wafer sections, said first wafer section having a function different from said second wafer section.

19. The component of claim 10 wherein said component supplies memory to the electronic device.

20. A component for an electronic device, comprising:
   a) first and second semiconductor wafers, each of said wafers comprising a semiconductor substrate having a front with a plurality of die formed thereon and therein, and a back;
   b) an electrically nonconductive interconnect flexibly coupling said wafers, said back of said first wafer connected with said front of said second wafer, wherein said interconnect expands and contracts as said wafers expand and contract;
   c) an electrical connection at a location remote from said first and second wafers which electrically couples circuitry on said wafers including beams of conductive circuitry along an edge of said wafer sections;
   d) a clamp for electrically coupling said wafers with the electronic device wherein contacts on said clamp couple with said wafers and receives electrical signals therefrom, and transfers said electrical signals to the electronic device.

21. The component of claim 20 wherein said electrical signals are transferred from said wafers to the electronic device through leads on said clamp.

22. The component of claim 20 wherein said component supplies memory to the electronic device.

23. A component for an electronic device, comprising:
   a) a semiconductor wafer section comprising a semiconductor substrate having a front with a plurality of die formed thereon and therein, and a back;
   b) beams of conductive circuitry along an edge of said wafer section at a location remote from said wafer section;
   c) a clamp for electrically coupling said wafer section with the electronic device wherein contacts on said clamp electrically couple with said beams and receives electrical signals therefrom, and transfers said electrical signals to the electronic device.

24. The component of claim 23 wherein said component supplies memory to the electronic device.

25. The component of claim 23 wherein said component comprises first and second wafer sections, said first wafer section having a function different from said second wafer section.

* * * * *